US008653616B2

(12) United States Patent
Kamada et al.

(10) Patent No.: US 8,653,616 B2
(45) Date of Patent: Feb. 18, 2014

(54) PHOTOELECTRIC CONVERSION DEVICE

(75) Inventors: Rui Kamada, Higashiomi (JP); Shuichi Kasai, Kagoshima (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/807,050

(22) PCT Filed: Jun. 28, 2011

(86) PCT No.: PCT/JP2011/064798
§ 371 (c)(1),
(2), (4) Date: Dec. 27, 2012

(87) PCT Pub. No.: WO2012/002381
PCT Pub. Date: Jan. 5, 2012

(65) Prior Publication Data
US 2013/0099226 A1    Apr. 25, 2013

(30) Foreign Application Priority Data
Jun. 30, 2010    (JP) .................. 2010-148477

(51) Int. Cl.
*H01L 31/0272*    (2006.01)
*H01L 31/032*    (2006.01)

(52) U.S. Cl.
USPC ............. 257/431; 257/42; 257/43; 257/432; 257/E21.068; 257/E29.081; 257/E31.027; 438/1; 438/95; 438/98; 136/252; 136/256; 136/258; 136/262

(58) Field of Classification Search
USPC ............. 257/42, 43, 431, 432, E21.068, 257/E29.081, E31.027; 438/1, 95, 98; 136/252, 256, 258, 262
See application file for complete search history.

(56) References Cited

U.S. PATENT DOCUMENTS 6,281,036 B1    8/2001    Niki et al.
6,566,162 B2    5/2003    Yamada et al.
(Continued)

FOREIGN PATENT DOCUMENTS

JP    H08-060359 A    3/1996
JP    H08-130321 A    5/1996
(Continued)

OTHER PUBLICATIONS

International Preliminary Report on Patentability issued for International Application No. PCT/JP2011/064798.
(Continued)

*Primary Examiner* — Dao H Nguyen
(74) *Attorney, Agent, or Firm* — Procopio, Cory, Hargreaves & Savitch LLP

(57) ABSTRACT

It is aimed to provide a photoelectric conversion device having high adhesion between a first semiconductor layer and an electrode layer as well as high photoelectric conversion efficiency. A photoelectric conversion device comprises an electrode layer, a first semiconductor layer located on the electrode layer and comprising a chalcopyrite-based compound semiconductor of group I-III-VI and oxygen, and a second semiconductor layer located on the first semiconductor layer and forming a pn junction with the first semiconductor layer. In the photoelectric conversion device, the first semiconductor layer has a higher molar concentration of oxygen in a part located on the electrode layer side with respect to a center portion in a lamination direction of the first semiconductor layer than a molar concentration of oxygen in the whole of the first semiconductor layer.

7 Claims, 3 Drawing Sheets

(56) References Cited

U.S. PATENT DOCUMENTS

| | | | | |
|---|---|---|---|---|
| 8,148,194 B2* | 4/2012 | Fujii et al. | | 438/98 |
| 2002/0160539 A1 | 10/2002 | Yamada et al. | | |
| 2011/0097841 A1* | 4/2011 | Krasnov et al. | | 438/98 |
| 2011/0197967 A1* | 8/2011 | Kaijo et al. | | 136/256 |
| 2013/0026588 A1* | 1/2013 | Kubo et al. | | 257/431 |
| 2013/0069187 A1* | 3/2013 | Asao et al. | | 257/431 |
| 2013/0125982 A1* | 5/2013 | Oguri et al. | | 136/258 |

FOREIGN PATENT DOCUMENTS

| | | | |
|---|---|---|---|
| JP | 2000-114561 A | 4/2000 | |
| JP | 2000-156517 A | 6/2000 | |
| JP | 2002-329877 A | 11/2002 | |
| JP | 2003-258282 A | 9/2003 | |
| JP | 2003-282600 A | 10/2003 | |
| JP | 2010-129640 A | 6/2010 | |
| WO | 2011/040272 A1 | 4/2011 | |

OTHER PUBLICATIONS

Inernational Search Report issued for the International Application No. PCT/JP2011/064798.

* cited by examiner

PHOTOELECTRIC CONVERSION DEVICE

TECHNICAL FIELD

The present invention relates to a photoelectric conversion device.

BACKGROUND ART

As photoelectric conversion devices, there are devices including a light-absorbing layer comprised of a chalcopyrite-based group I-III-VI compound semiconductor such as CIGS. Japanese Patent Application Laid-Open No. 2000-156517 discloses an example in which a light-absorbing layer comprised of a group I-III-VI compound semiconductor is provided on a backside electrode formed on a substrate. A buffer layer comprised of ZnS, CdS, or the like and a transparent conductive film comprised of ZnO or the like are formed on the light-absorbing layer.

In those photoelectric conversion devices, the diffusion length of minority carriers (electrons) generated in the light-absorbing layer is reduced due to a large number of defects present in a light-absorbing layer. As a result, in some cases, the minority carriers disappear due to the recombination with holes before being extracted by electrodes or the like. In particular, the minority carriers generated in the light-absorbing layer on the backside electrode side have to be diffused over a long length, and thus are susceptible to the defects present in the light-absorbing layer. This may lead to a decrease in photoelectric conversion efficiency.

SUMMARY OF THE INVENTION

An object of the present invention is to reduce the occurrence of recombination of minority carriers due to defects in a light-absorbing layer, to thereby improve photoelectric conversion efficiency.

A photoelectric conversion device according to an embodiment of the present invention comprises an electrode layer, and a first semiconductor layer that is located on the electrode layer and comprises a chalcopyrite-based compound semiconductor of group I-III-VI and oxygen. This photoelectric conversion device according to the present embodiment comprises a second semiconductor layer that is located on the first semiconductor layer and forms a pn junction with the first semiconductor layer. In this photoelectric conversion device according to the present embodiment, a molar concentration of oxygen in a part located on the electrode layer side with respect to a center portion in a lamination direction of the first semiconductor layer is higher than a molar concentration of oxygen in the whole of the first semiconductor layer.

According to the photoelectric conversion device of the embodiment of the present invention, even if defects are generated in a part located on the electrode side of the light-absorbing layer, the defects are more likely to be filled with oxygen. Accordingly, the diffusion length of minority carriers generated in that part increases, which enables to reduce the occurrence of recombination of carriers. This results in improvement of photoelectric conversion efficiency.

EMBODIMENT FOR CARRYING OUT THE INVENTION

Figure 1:
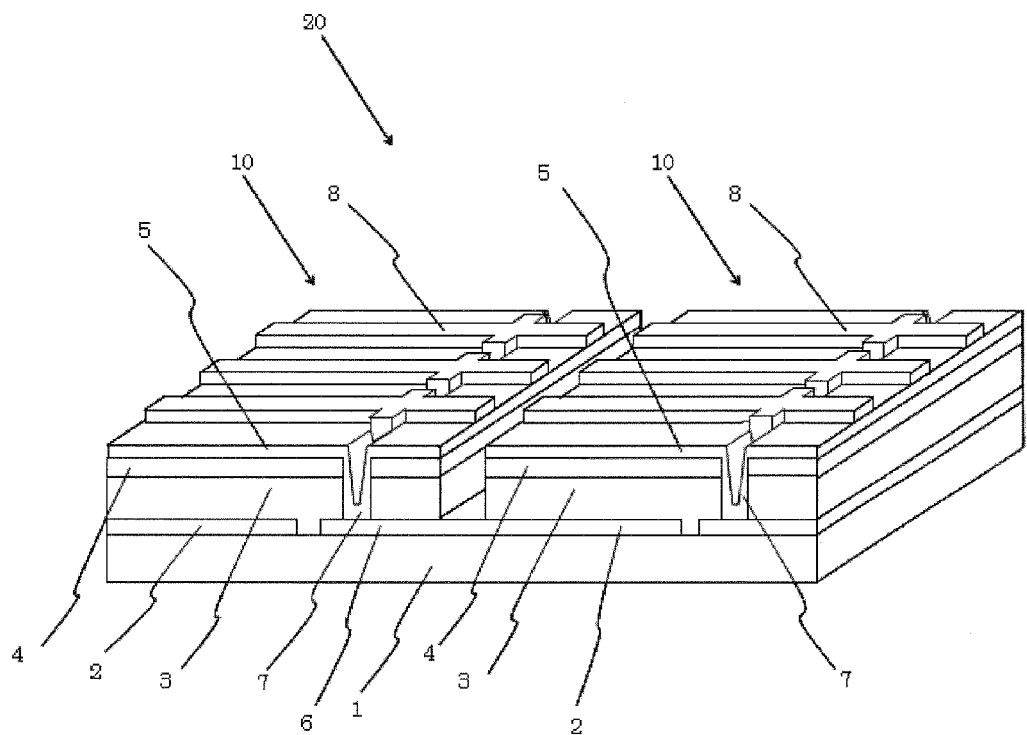
FIG. 1 is a perspective view showing an example of an embodiment of a photoelectric conversion device of the present invention.
Figure 2:
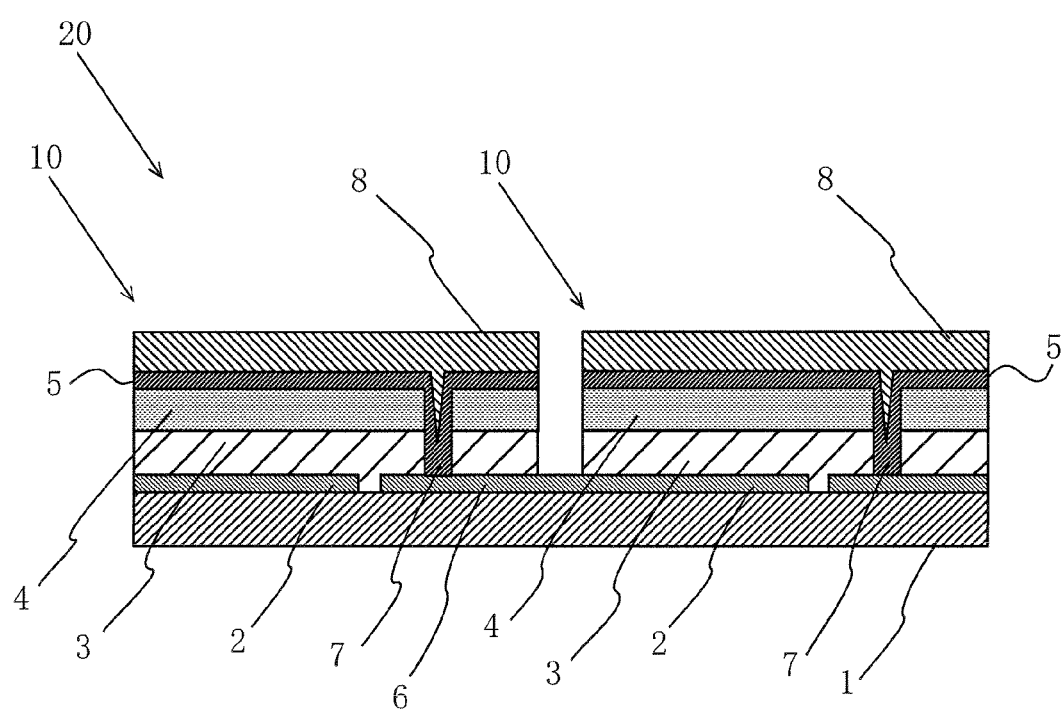
FIG. 2 is a cross-sectional view showing the example of the embodiment of the photoelectric conversion device of the present invention.

As shown in FIGS. 1 and 2, a photoelectric conversion device 10 according to an embodiment of the present invention includes a substrate 1, a first electrode layer 2, a first semiconductor layer 3, a second semiconductor layer 4, and a second electrode layer 5. The photoelectric conversion device 10 includes a third electrode layer 6 spaced apart from the first electrode layer 2 and located on the substrate 1 side of the first semiconductor layer 3. The neighboring photoelectric conversion devices 10 are electrically connected to each other by a connection conductor 7. That is, the second electrode layer 5 of one photoelectric conversion device 10 and the third electrode layer 6 of the other photoelectric conversion device 10 are connected by the connection conductor 7. The third electrode layer 6 also serves as the first electrode layer 2 of the neighboring photoelectric conversion device 10. As a result, the neighboring photoelectric conversion devices 10 are connected to each other in series. The connection conductor 7 is provided so as to separate the first semiconductor layer 3 and the second semiconductor layer 4 in one photoelectric conversion device 10. Accordingly, in the photoelectric conversion device 10, photoelectric conversion is performed by the first semiconductor layer 3 and the second semiconductor layer 4 that are sandwiched between the first electrode layer 2 and the second electrode layer 5. Additionally, a collector electrode 8 may be provided on the second electrode layer 5 as in the present embodiment.

The substrate 1 serves to support the photoelectric conversion devices 10. Examples of the material used for the substrate 1 include glass, ceramics, resins and the like.

The first electrode layer 2 and the third electrode layer 6 are comprised of, for example, molybdenum (Mo), aluminium (Al), titanium (Ti), gold (Au) or the like. The first electrode layer 2 and the third electrode layer 6 are formed on the substrate 1 by a sputtering method, a vapor deposition method or the like.

The first semiconductor layer 3 absorbs light and performs photoelectric conversion in cooperation with the second semiconductor layer 4. The first semiconductor layer 3 includes a chalcopyrite-based compound semiconductor and is provided on the first electrode layer 2 and the third electrode layer 6. Here, the chalcopyrite-based compound semiconductor means a compound semiconductor (also referred to as a CIS-based compound semiconductor) containing a group I-B element (also referred to as a group 11 element), a group III-B element (also referred to as a group 13 element), and a group VI-B element (also referred to as a group 16 element). Examples of the chalcopyrite-based compound semiconductor of group I-III-VI include $Cu(In, Ga)Se_2$ (also referred to as CIGS), $Cu(In, Ga)(Se, S)_2$ (also referred to as CIGSS), and $CuInS_2$ (also referred to as CIS). Note that $Cu(In, Ga)Se_2$ is a compound mainly comprised of Cu, In, Ga, and Se. Further, $Cu(In, Ga)(Se, S)_2$ is a compound mainly comprised of Cu, In, Ga, Se, and S.

It is sufficient that the first semiconductor layer 3 has a thickness of, for example, 1 to 2.5 μm. This increases photoelectric conversion efficiency.

The first semiconductor layer 3 contains oxygen in addition to a chalcopyrite-based compound semiconductor of group I-III-VI. The oxygen described above serves to fill the defects present in the chalcopyrite-based compound semiconductor. These defects mean a portion, which becomes a void as a result of the desorption of atoms from a partial site of a chalcopyrite structure. The above-mentioned oxygen serves to fill the defects (void). In other words, the void of the chalcopyrite structure is substituted by oxygen.

Figure 3:
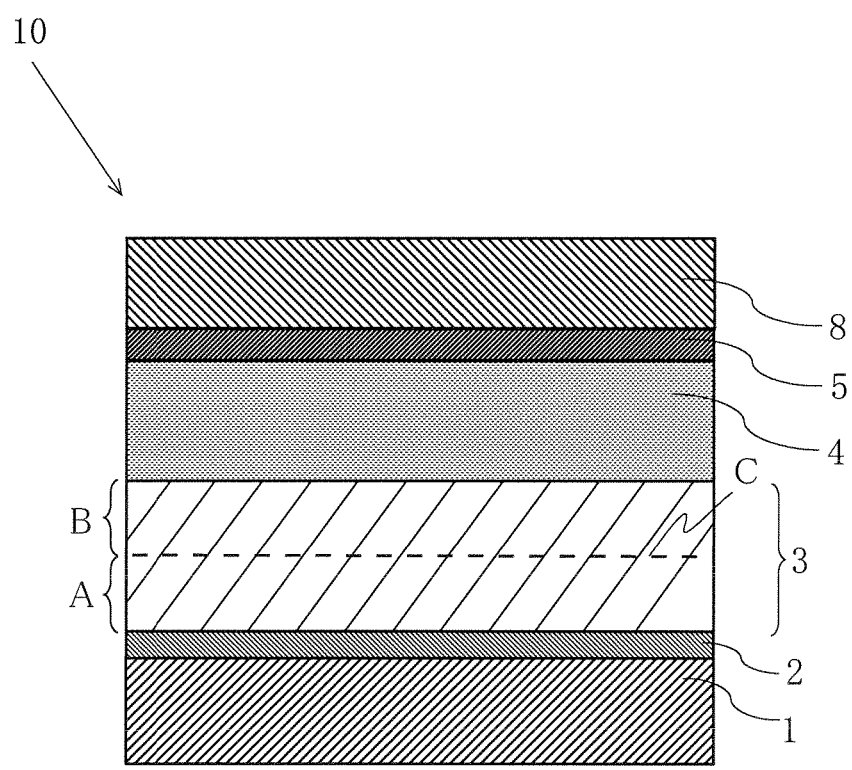
FIG. 3 is a schematic cross-sectional view for describing the embodiment of the photoelectric conversion device of the present invention.

As shown in FIG. 3, the first semiconductor layer 3 is divided into a part A located on the first electrode layer 2 side with respect to a center portion in the lamination direction of the first semiconductor layer 3 and a part B located on the second semiconductor layer 4 side with respect to the center portion in the lamination direction of the first semiconductor layer 3. Here, the center portion in the lamination direction of the first semiconductor layer 3 refers to the vicinity of an imaginary center line C (dotted line in FIG. 3) drawn in the middle portion of the first semiconductor layer 3 along the direction orthogonal to the lamination direction (thickness direction) of the first semiconductor layer 3.

The molar concentration of oxygen in the part A of the first semiconductor layer 3 is higher than the molar concentration of oxygen in the whole of the first semiconductor layer 3. This increases the molar concentration of oxygen in the part A of the first semiconductor layer 3, and the defects in the part A of the first semiconductor layer 3 are more likely to be filled with oxygen. As a result, the diffusion length of the minority carriers generated in the part A of the first semiconductor layer 3 increases. Accordingly, the minority carriers reach the second electrode layer 5 more easily. This is because the occurrence of recombination of minority carriers decreases. Therefore, photoelectric conversion efficiency is improved.

In the first semiconductor layer 3, an excessive increase in molar concentration of oxygen described above results in that, at times, oxygen is present also in the portion other than the portion where the defects are present and oxygen per se becomes defects. Therefore, the molar concentration of oxygen in the whole of the first semiconductor layer 3 may be 1 to 5 mol %. The molar concentration of oxygen in the whole of the first semiconductor layer 3 means an average molar concentration of oxygen in the first semiconductor layer 3. Meanwhile, the molar concentration of oxygen in the part A of the first semiconductor layer 3 is higher than the molar concentration of oxygen in the whole of the first semiconductor layer 3 by approximately 1 to 5 mol %. The first semiconductor layer 3 having the molar concentration of oxygen in the above-mentioned range is likely to reduce the generation of unnecessary defects while appropriately filling defects with oxygen.

For example, the first semiconductor layer 3 is manufactured as follows. First, a material solution containing a group I-B element, a group III-B element, and a group VI-B element is applied onto the substrate 1 provided with the first electrode layer 2, to thereby form a first applied film (Step A1). Then, the first applied film is heat-treated under an oxygen atmosphere, to thereby form a first precursor (Step A2). The temperature for forming the first precursor in Step A2 is 200 to 300° C. Then, the first precursor is heated under an atmosphere including the group VI-B element or an inert atmosphere of nitrogen, argon, or the like, to thereby form a first layer (Step A3). The temperature for forming the first layer in Step A3 is 400 to 500° C. Then, the material solution containing the group I-B element, the group III-B element, and the group VI-B element is applied onto the first layer, to thereby form a second applied film (Step A4). Then, the second applied film is heat-treated under an oxygen atmosphere, to thereby form a second precursor (Step A5). The temperature for forming the second precursor in Step A5 is 200 to 300° C. Then, the second precursor is heated under an atmosphere including the group VI-B element or an inert atmosphere of nitrogen, argon, or the like, to thereby form a second layer (Step A6). The temperature for forming the second layer in Step A6 is 400 to 500° C. Then, the material solution containing the group I-B element, the group III-B element, and the group VI-B element is applied onto the second layer, to thereby form a third applied film (Step A7). Then, the third applied film is heat-treated under an oxygen atmosphere, to thereby form a third precursor (Step A8). The temperature for forming the third precursor in Step A8 is 200 to 300° C. Then, the third precursor is heated under an atmosphere including the group VI-B element or an inert atmosphere of nitrogen, argon, or the like, to thereby form a third layer (Step A9). The temperature for forming the third layer in Step A9 is 400 to 500° C. The first semiconductor layer 3 comprised of three semiconductor layers is formed through the steps described above. It is sufficient that in a case of manufacturing the first semiconductor layer 3 by laminating three semiconductor layers or more, for example, Steps A1 to A9 described above are repeated.

The first semiconductor layer 3 including a plurality of layers having different molar concentrations of oxygen can be obtained by varying the oxygen concentration in the oxygen atmosphere when each layer is formed. The first semiconductor layer 3 is allowed to have a higher molar concentration of oxygen in the part A located on the first electrode layer 2 side by reducing the amount of oxygen to be introduced in the order of, for example, Step A2, Step A5, and Step A8. Specifically, in the case of forming the first semiconductor layer 3 through Steps A1 to A9 as described above, it is sufficient that, for example, the amount of oxygen introduced in Step A2 is approximately 100 ppm, the amount of oxygen introduced in Step A5 is approximately 50 ppm, and the amount of oxygen introduced in Step A8 is 10 ppm or smaller. Examples of the method of increasing the molar concentration of oxygen in the part A include the method of reducing a period of time for heat-treatment under an oxygen atmosphere in the order of Step A2, Step A5, and Step A8. As another method, the first semiconductor layer 3 is formed without introducing oxygen, and then, the first semiconductor layer 3 is subjected to reduction treatment under, for example, a hydrogen atmosphere. This method can reduce the content of oxygen in the part B of the first semiconductor layer 3 compared with the part A of the first semiconductor layer 3.

The temperature for forming each layer of the first semiconductor layer 3 in the above-mentioned method refers to the temperature of the atmosphere in each step. Meanwhile, the temperatures when forming the first to third layers may be the temperature of the substrate 1 per se in each method. In such a case, the temperature of the substrate 1 can be adjusted more easily than the temperature of the atmosphere. This simplifies the manufacturing steps.

The above-mentioned molar concentration of oxygen of the first semiconductor layer 3 can be measured by, for example, X-ray photoelectron spectroscopy (XPS), Auger electron spectroscopy (AES), secondary ion mass spectroscopy (SIMS) or the like. In those methods, measurements are performed while shaving the first semiconductor layer 3 in the depth direction by a sputtering method.

The molar concentration of oxygen in the part A of the first semiconductor layer 3 is obtained as an average ten value of the molar concentrations measured at appropriate ten spots in the part A by the above-mentioned measuring method. The molar concentration of oxygen in the whole of the first semiconductor layer 3 is obtained as an average value of the molar concentrations measured at appropriate ten spots in the first semiconductor layer 3. For example, the molar concentration of oxygen of the first semiconductor layer 3 was measured by secondary ion mass spectroscopy which shaves the first semiconductor layer 3 in the depth direction by a sputtering method while irradiating the first semiconductor layer 3 with an ion beam of cesium, with the result that the molar concentration of oxygen in the whole of the first semiconductor layer 3 was 5 mol %. The molar concentration of oxygen in the part A of the first semiconductor layer 3 was 10 mol %. In the photoelectric conversion device 10 as described above, the generation of defects due to oxygen can be reduced while increasing the diffusion length of minority carriers in the part A, accordingly this leads to high photoelectric conversion efficiency.

Further, the chalcopyrite-based compound semiconductor may contain a plurality of crystal grains. In this case, the average grain diameter of the crystal grains in the part A of the first semiconductor layer 3 may be smaller than the average grain diameter of the above-mentioned crystal grains in the first semiconductor layer 3. This enables the first semiconductor layer 3 to have a smaller grain diameter of crystal grains in the part that is in contact with the first electrode layer 2. As a result, the adhesion between the first electrode layer 2 and the first semiconductor layer 3 is enhanced. Further, in such a manner, the defects prone to be generated due to a reduced grain diameter are more likely to be filled with oxygen in the part A of the first semiconductor layer 3.

It is sufficient that the average grain diameter of crystal grains of the first semiconductor layer 3 is, for example, 0.5 to 2 µm. This reduces the recombination at a grain boundary. Moreover, roughness on the surface of the first semiconductor layer 3 is reduced. In this case, it is sufficient that the average grain diameter of crystal grains in the part A of the first semiconductor layer 3 is 0.05 to 0.3 µm. As a result, the adhesion with the first electrode layer 2 can be enhanced while reducing the generation of excessive defects in the first semiconductor layer 3. The grain diameter of crystal grains can be obtained by, for example, writing a boundary of crystal grains into a photomicrograph of a cross section, and then, calculating a grain diameter with the use of given image processing software. Examples of the method of reducing a grain diameter in the part A of the first semiconductor layer 3 include the method of lowering the temperature for forming the first precursor in Step A2 than the temperatures for forming the second precursor and the third precursor in Step A5 and Step A8 by approximately 10 to 30° C.

In the case of the application method as described above, the material solution to be used may contain a group I-B metal, a group III-B metal, a chalcogen element-containing organic compound, and a Lewis base organic solvent. The group I-B metal and the group III-B metal can dissolve well in a solvent containing the chalcogen element-containing organic compound and the Lewis base organic solvent (hereinafter also called as a mixed solvent S). The mixed solvent S as described above enables to produce a material solution in which the concentration of the total of the group I-B metal and the group III-B metal to the mixed solvent S is 6 wt % or higher. The use of the mixed solvent S as described above increases the solubility of the above-mentioned metals, so that a high-concentration material solution can be obtained. Next, the material solution is described in detail.

The chalcogen element-containing organic compound refers to an organic compound containing a chalcogen element. The chalcogen element refers to S, Se, or Te among the group VI-B elements. In a case where the chalcogen element is S, examples of the chalcogen element-containing organic compound include thiol, sulfid, disulfid, thiophene, sulfoxide, sulfone, thioketone, sulfonic acid, sulfonate ester, sulfonic acid amide and the like. Among the compounds above, thiol, sulfid, disulfid, and the like is likely to form a complex with a metal. If the chalcogen element-containing organic compound includes a phenyl group, the application properties of the material solution are enhanced. Examples of the above-mentioned compound include, for example, thiophenol, diphenyl sulfide, and derivatives thereof.

In a case where the chalcogen element is Se, examples of the chalcogen element-containing organic compound include selenol, selenide, diselenide, selenoxide, selenone and the like. Among the compounds above, selenol, selenide, diselenide, and the like is likely to form a complex with a metal. If the chalcogen element-containing organic compound is phenylselenol, phenyl selenide and diphenyl selenide each including a phenyl group, or derivatives thereof, the application properties of the material solution are enhanced.

In a case where the chalcogen element is Te, examples of the chalcogen element-containing organic compound include tellurol, telluride, ditelluride and the like.

The Lewis base organic solvent is an organic solvent containing a substance that may be a Lewis group. Examples of the Lewis base organic solvent include pyridine, aniline, triphenyl phosphine, and derivatives thereof. The Lewis base organic solvent can enhance coatability if the boiling point thereof is 100° C. or higher.

The group I-B metal and the chalcogen element-containing organic compound may be chemically bonded to each other. Further, the group III-B metal and the chalcogen element-containing organic compound may be chemically bonded to each other. Still further, the chalcogen element-containing organic compound and the Lewis base organic solvent may be chemically bonded to each other. As described above, if the metal or/and the Lewis base organic solvent and the like, and the chalcogen element-containing organic compound are chemically bonded, the metal occupies 8% by mass or more to provide a higher-concentration material solution. Examples of the above-mentioned chemical bond include coordinate bond between respective elements. Such chemical bond can be confirmed by, for example, a nuclear magnetic resonance (NMR) method. In the NMR method, the chemical bond between the group I-B metal and the chalcogen element-containing organic compound can be detected as a peak shift of multinuclear NMR of a chalcogen element. The chemical bond between the group III-B metal and the chalcogen element-containing organic compound can be detected as a peak shift of multinuclear NMR of a chalcogen element. The chemical bond between the chalcogen element-containing organic compound and the Lewis base organic solvent can be detected as a peak shift resulting from an organic solvent. It is sufficient that the number of moles of chemical bond between the group I-B metal and the chalcogen element-containing organic compound falls within the range of 0.1 to 10 times the number of moles of chemical bond between the chalcogen element-containing organic compound and the Lewis base organic solvent.

The mixed solvent S may be prepared by mixing the chalcogen element-containing organic compound and the Lewis base organic solvent together so as to be liquid at room temperature. As a result, the mixed solvent S can be handled easily. For example, the chalcogen element-containing organic compound in an amount of 0.1 to 10 times the amount of the Lewis base organic solvent may be mixed thereto. Accordingly, the above-mentioned chemical bond can be formed excellently, and a high-concentration solution of a group I-B metal and a group III-B metal can be obtained.

The material solution is obtained directly dissolving the group I-B metal and the group III-B metal in the mixed solvent S. The method as described above can reduce the inclusion of impurities other than the components of a compound semiconductor in the first semiconductor layer 3. Note that any of the group I-B metal and the group III-B metal may be a metal salt. Here, directly dissolving the group I-B metal and the group III-B metal in the mixed solvent S refers to directly incorporating the raw metal of a single metal or the raw metal of an alloy in the mixed solvent S to be dissolved. As a result, the raw metal of a single metal or the raw metal of an alloy is not required to be once changed into another compound (for example, metal salt such as a chloride) and then be dissolved in a solvent. Therefore, the method as describe above can simplify the steps and reduce the inclusion of impurities other than the elements composing the first semiconductor layer 3 in the first semiconductor layer 3. This enhances the purity of the first semiconductor layer 3.

The group I-B metals include Cu and/or Ag. The group I-B metal may contain one element or two or more elements. In a case where two or more elements of group I-B metals are used, a mixture of two or more elements of group I-B metals may be dissolved in the mixed solvent S at one time. Meanwhile, the group I-B metals of the corresponding elements may be individually dissolved in the mixed solvent S and then mixed together.

The group III-B metals include Ga and/or In. The group III-B metals may contain one element or two or more elements. In a case where two or more elements of group III-B metals are used, the mixture containing two or more elements of group III-B metals may be dissolved in the mixed solvent S at one time. Meanwhile, the group III-B metals of the corresponding elements may be individually dissolved in the mixed solvent S and then mixed together.

The second semiconductor layer 4 is formed on the first semiconductor layer 3. The second semiconductor layer 4 refers to a semiconductor layer that forms a heterojunction (pn junction) with the first semiconductor layer 3. Therefore, a pn junction is formed at an interface between the first semiconductor layer 3 and the second semiconductor layer 4 or near the interface. If the first semiconductor layer 3 is a p-type semiconductor, the second semiconductor layer 4 is an n-type semiconductor. If the second semiconductor layer 4 has a resistivity of 1 Ω·cm or more, a current leakage can be reduced further. Examples of the second semiconductor layer 4 include CdS, ZnS, ZnO, In2S3, In(OH, S), (Zn, In)(Se, OH), (Zn, Mg)O and the like. The second semiconductor layer 4 is formed by, for example, a chemical bath deposition (CBD) method or the like. Note that In(OH, S) is a compound mainly comprised of In, OH, and S. (Zn, In)(Se, OH) is a compound mainly comprised of Zn, In, Se, and OH. (Zn, Mg)O is a compound mainly comprised of Zn, Mg, and O. If the second semiconductor layer 4 is light transmissive for the wavelength region of the light absorbed by the first semiconductor layer 3, the second semiconductor layer 4 can increase the light absorption efficiency in the first semiconductor layer 3.

In a case where the second semiconductor layer 4 contains indium (In), the second electrode layer 5 may contain an indium oxide. This enables to reduce a change of conductivity due to the interdiffusion of elements between the second semiconductor layer 4 and the second electrode layer 5. Further, the first semiconductor layer 3 may be formed of a chalcopyrite-based material containing indium. In such a manner, the first semiconductor layer 3, the second semiconductor layer 4, and the second electrode layer 5 contain indium, whereby changes of conductivity and carrier concentration due to the interdiffusion of elements between layers can be reduced.

If the second semiconductor layer 4 contains the group III-VI compound as a main component, the moisture resistance of the photoelectric conversion device 10 can be improved. Note that the group III-VI compound refers to a compound of a group III-B element and a group VI-B element. The fact that a group III-VI compound is included as a main component indicates that the concentration of the group III-VI compound in the second semiconductor layer 4 is 50 mol % or more. Further, the concentration of the group III-VI compound in the second semiconductor layer 4 may be 80 mol % or more. The second semiconductor layer 4 may contain Zn at 50 at % or less. This enables to improve the moisture resistance of the photoelectric conversion device 10. Further, the second semiconductor layer 4 may contain Zn at 20 at % or less.

It is sufficient that the second semiconductor layer 4 has a thickness of, for example, 10 to 200 nm or 100 to 200 nm. This enables to suppress a reduction of photoelectric conversion efficiency under high-temperature and high-humidity conditions.

The molar concentration of oxygen of the first semiconductor layer 3 may gradually increase from the part on the second semiconductor layer 4 side toward the part on the first electrode layer 2 side. This enables to reduce the molar concentration of oxygen in the part B of the first semiconductor layer 3 while increasing the molar concentration of oxygen in the part A of the first semiconductor layer 3. In the part B of the first semiconductor layer 3, the distance to the second electrode layer 5 from which minority carriers are extracted is smaller than that in the part A of the first semiconductor layer 3. Accordingly, in the part B of the first semiconductor layer 3, minority carriers reach the second electrode layer 5 easily even if the diffusion length thereof is relatively short. Meanwhile, oxygen excessively present in the first semiconductor layer 3 may become defects per se. For this reason, oxygen as little as possible is preferred in the part B of the first semiconductor layer 3 in which a larger number of carriers are present compared with the part A of the first semiconductor layer 3. Therefore, in the present embodiment, the diffusion length of minority carriers in the part A of the first semiconductor layer 3 can be increased, and besides, the occurrence of recombination of carriers generated due to excessive oxygen in the part B of the first semiconductor layer 3 can be reduced.

In this case, a difference between the molar concentration of oxygen of the first semiconductor layer 3 near the first electrode layer 2 and the molar concentration of oxygen of the first semiconductor layer 3 near the second semiconductor layer 4 is approximately 1 to 5 mol %. The portion of the first semiconductor layer 3 near the first electrode layer 2 refers to the region from the contact surface with the first electrode layer 2 of the first semiconductor layer 3 to the portion having a thickness of 1/10 of the entire thickness of the first semiconductor layer 3. Meanwhile, the portion of the first semiconductor layer 3 near the second semiconductor layer 4 refers to the region from the contact surface with the second semiconductor layer 4 of the first semiconductor layer 3 to the portion having a thickness of 1/20 of the entire thickness of the first semiconductor layer 3.

Examples of the method of manufacturing the first semiconductor layer 3 include the method of gradually reducing an amount of oxygen to be introduced in the order of Step A2, Step A5, and Step A8 described above. In another manufacturing method, the period of time for heat treatment under an oxygen atmosphere is gradually reduced in the order of Step A2, Step A5, and Step A8.

As another embodiment, in the first semiconductor layer 3, the molar concentration of oxygen near the second semiconductor layer 4 may be made higher than the molar concentration of oxygen in the whole of the first semiconductor layer 3. This enhances the passivation effect in the surface part of the first semiconductor layer 3 located on the second semiconductor layer 4 side. Accordingly, the generation of defects can be reduced on the surface of the first semiconductor layer 3 prior to the formation of the second semiconductor layer 4. On this occasion, the portion of the first semiconductor layer 3 near the second semiconductor layer 4 refers to the region from the contact surface of the first semiconductor layer 3 with the second semiconductor layer 4 to the portion having a thickness of 1/20 of the entire thickness of the first semiconductor layer 3. It is sufficient that the molar concentration of oxygen of the first semiconductor layer 3 near the second semiconductor layer 4 is 10 to 50 mol %. As a result, the passivation effect can be enhanced while reducing the generation of defects due to excessive oxygen in such a manner. It is sufficient that the molar concentration of oxygen of the first semiconductor layer 3 near the second semiconductor layer 4 is higher than the molar concentration of oxygen in the whole of the first semiconductor layer 3 by approximately 5 to 10 mol %.

As the method of manufacturing the first semiconductor layer 3, in a case of manufacturing through Steps A1 to A9 described above, oxygen may be introduced in, for example, Step A9. Alternatively, the first semiconductor layer 3 can be manufactured also by the heat treatment of the first semiconductor layer 3 under an atmosphere including oxygen after Step A9.

In the present embodiment, the molar concentration of oxygen of the first semiconductor layer 3 can be measured by the measuring method such as X-ray photoelectron spectroscopy described above. The molar concentration of oxygen of the first semiconductor layer 3 near the second semiconductor layer 4 is obtained as an average value of the molar concentrations measured at appropriate ten spots in the portion of the first semiconductor layer 3. For example, the molar concentration of oxygen of the first semiconductor layer 3 was measured by secondary ion mass spectroscopy which shaves the first semiconductor layer 3 in the depth direction by a sputtering method while irradiating the first semiconductor layer 3 with an ion beam of cesium, with the result that the molar concentration of oxygen in the whole of the first semiconductor layer 3 was 5 mol %. The molar concentration of oxygen of the first semiconductor layer 3 near the second semiconductor layer 4 was 15 mol %. In the photoelectric conversion device 10 as described above, the passivation effect in the surface part of the first semiconductor layer 3 located on the second semiconductor layer 4 side can be enhanced, accordingly this leads to high photoelectric conversion efficiency.

In a case where the first semiconductor layer 3 includes selenium, the molar concentration of selenium in the part located on the first electrode layer 2 side with respect to the center portion in the lamination direction of the first semiconductor layer 3 may be lower than the molar concentration of selenium in the whole of the first semiconductor layer 3. That is, in FIG. 3, the molar concentration of selenium in the part A of the first semiconductor layer 3 is lower than the molar concentration of selenium in the whole of the first semiconductor layer 3. This allows an energy band to incline in the part A of the first semiconductor layer 3. As a result, the carriers generated through irradiation of the first semiconductor layer 3 and the second semiconductor layer 4 with light are efficiently transported to the vicinity of the pn junction. Therefore, photoelectric conversion efficiency is increased owing to the increased efficiency of collecting carriers.

It is sufficient that the molar concentration of selenium in the whole of the first semiconductor layer 3 is 40 to 60 mol %. It is sufficient that the molar concentration of selenium in the part A of the first semiconductor layer 3 is 30 to 50 mol %. The molar concentration of selenium of the first semiconductor layer 3 can be measured by the same method as the method of measuring the molar concentration of oxygen. The molar concentration of selenium in the whole of the first semiconductor layer 3 is obtained as an average value of the molar concentrations measured at appropriate ten spots of the first semiconductor layer 3. The molar concentration of selenium in the part A of the first semiconductor layer 3 is obtained as an average value of the molar concentrations measured at appropriate ten spots in the part A of the first semiconductor layer 3. For example, the molar concentration of selenium of the first semiconductor layer 3 was measured by secondary ion mass spectroscopy, with the result that the molar concentration of selenium in the whole of the first semiconductor layer 3 was 50 mol %. The molar concentration of selenium of the first semiconductor layer 3 in the part A of the first semiconductor layer 3 was 40 mol %. In the photoelectric conversion device 10 as described above, photoelectric conversion efficiency is increased owing to the increased efficiency of collecting carriers.

As the method of manufacturing the first semiconductor layer 3, in a case where, for example, Steps A1 to A9 described above are used, a third layer may be formed of a material solution having a higher selenium concentration than the selenium concentration of the material solution of a first layer. It is sufficient that the selenium concentration of the material solution of a second layer is identical to the selenium concentration of the material solution of the first layer or is higher than the selenium concentration of the material solution of the first layer.

In the first semiconductor layer 3, the molar concentration of selenium in a part located near the first electrode layer 2 may be higher than the molar concentration of selenium in the part located on the first electrode layer 2 side with respect to the center portion in the lamination direction of the first semiconductor layer 3. That is, in FIG. 3, the molar concentration of selenium of the first semiconductor layer 3 near the first electrode layer 2 is higher than the molar concentration of selenium in the part A of the first semiconductor layer 3. This enables to make, in the first semiconductor layer 3, the molar concentration of oxygen in the part located near the first electrode layer 2 relatively lower compared with the other portion of the first semiconductor layer 3. Accordingly, in the case where the first electrode layer 2 includes molybdenum, the generation of a molybdenum oxide is reduced at the interface between the first electrode layer 2 and the first semiconductor layer 3. Meanwhile, a molybdenum selenide is likely to be generated at the interface between the first electrode layer 2 and the first semiconductor layer 3. As a result, an increase of resistance value at the interface between the first electrode layer 2 and the first semiconductor layer 3 is reduced, accordingly this leads to an increase of photoelectric conversion efficiency.

It is sufficient that the molar concentration of selenium in the part A of the first semiconductor layer 3 is 30 to 50 mol %. It is sufficient that the molar concentration of selenium of the first semiconductor layer 3 near the first electrode layer 2 is 50 to 70 mol %. The molar concentration of selenium of the first semiconductor layer 3 in the present embodiment can be measured and calculated by the same method as the method of measuring the molar concentration of selenium in the embodiment above.

For example, the molar concentration of selenium of the first semiconductor layer 3 was measured by secondary ion mass spectroscopy, with the result that the molar concentration of selenium in the part A of the first semiconductor layer 3 was 40 mol %. The molar concentration of selenium of the first semiconductor layer 3 near the first electrode layer 2 was 60 mol %. In the photoelectric conversion device 10 as described above, the generation of a molybdenum selenide is stimulated, accordingly this leads to an increase of photoelectric conversion efficiency.

As the method of manufacturing the first semiconductor layer 3, in a case where, for example, Steps A1 to A9 described above are used, the surface of the first electrode layer 2 including molybdenum may be selenized prior to Step A1. It is sufficient that in the selenization as described above, the substrate 1 on which the first electrode layer 2 is formed is placed in a furnace and is baked at approximately 200 to 500° C. under an atmosphere with selenium concentration of 10 to 1,000 ppm. It is sufficient that in this case, the baking time is approximately 1 to 120 minutes. As a result, a molybdenum selenide is formed on the surface of the first electrode layer 2, which increases the molar concentration of selenium of the first semiconductor layer 3 near the first electrode layer 2.

In a case where the first semiconductor layer 3 includes gallium, the molar concentration of gallium in the portion located on the first electrode layer 2 side with respect to the center portion in the lamination direction of the first semiconductor layer 3 may be lower than the molar concentration of gallium in the whole of the first semiconductor layer 3. That is, in FIG. 3, the molar concentration of gallium in the part A of the first semiconductor layer 3 is lower than the molar concentration of gallium in the whole of the first semiconductor layer 3. This enables to reduce the excessive generation of a gallium oxide in the part A of the first semiconductor layer 3 having a high molar concentration of oxygen. Accordingly, an increase in resistance value of the part A of the first semiconductor layer 3, which accompanies the generation of a gallium oxide, can be reduced, accordingly this leads to an increase of photoelectric conversion efficiency.

It is sufficient that the molar concentration of gallium in the whole of the first semiconductor layer 3 is 6 to 12 mol %. It is sufficient that the molar concentration of gallium in the part A of the first semiconductor layer 3 is 4 to 8 mol %. The molar concentration of gallium of the first semiconductor layer 3 can be measured by the same method as the above-mentioned method of measuring the molar concentration of oxygen. The molar concentration of gallium in the whole of the first semiconductor layer 3 is obtained as an average value of the molar concentrations measured at appropriate ten spots of the first semiconductor layer 3. The molar concentration of gallium in the part A of the first semiconductor layer 3 is obtained as an average value of the molar concentrations measured at appropriate ten spots in the part A of the first semiconductor layer 3. For example, the molar concentration of gallium of the first semiconductor layer 3 was measured by secondary ion mass spectroscopy, with the result that the molar concentration in the whole of the first semiconductor layer 3 was 8 mol %. The molar concentration of gallium of the first semiconductor layer 3 in the part A of the first semiconductor layer 3 was 5 mol %. In the photoelectric conversion device 10 as described above, the excessive generation of a gallium oxide in the part A of the first semiconductor layer 3 can be reduced, accordingly this leads to an increase of photoelectric conversion efficiency.

As the method of manufacturing the first semiconductor layer 3, in a case where, for example, Steps A1 to A9 described above are used, a third layer may be formed of a material solution having a higher gallium concentration than the gallium concentration of the material solution of a first layer. It is sufficient that the gallium concentration of the material solution of a second layer is identical to the gallium concentration of the material solution of the first layer or higher than the gallium concentration of the material solution of the first layer.

The second electrode layer 5 is a transparent conductive film comprised of indium tin oxide (ITO), ZnO, or the like and having a thickness of 0.05 to 3 μm. The second electrode layer 5 is formed by a sputtering method, a vapor deposition method, a chemical vapor deposition (CVD) method or the like. The second electrode layer 5 has a resistivity lower than that of the second semiconductor layer 4 and serves to extract the charges generated in the first semiconductor layer 3. If the second electrode layer 5 has a resistivity less than 1 Ω·cm and a sheet resistance of 50Ω/☐ or less, the second electrode layer 5 can extract charges well.

In order to further increase the absorption efficiency in the first semiconductor layer 3, the second electrode layer 5 may have high light permeability for the light absorbed in the first semiconductor layer 3. The second electrode layer 5 may have a thickness of 0.05 to 0.5 μm. Accordingly, the second electrode layer 5 can increase light permeability and reduce light reflection. In addition, the second electrode layer 5 can enhance a light scattering effect and transmit the current generated by photoelectric conversion well. If the refractive index is almost the same between the second electrode layer 5 and the second semiconductor layer 4, light reflection at the interface between the second electrode layer 5 and the second semiconductor layer 4 can be reduced.

The second electrode layer 5 may include a group III-VI compound as a main component. This improves humidity resistance of the photoelectric conversion device 10. The fact that a group III-VI compound is included as a main component indicates that the concentration of the group III-VI compound in the second electrode layer 5 is 50 mol % or more. Further, the concentration of the group III-VI compound in the second electrode layer 5 may be 80 mol % or more. Sill further, the concentration of Zn in the second electrode layer 5 may be 50 at % or less. This improves humidity resistance of the photoelectric conversion device 10. The concentration of Zn in the second electrode layer 5 may be 20 at % or less.

In the photoelectric conversion device 10, the portion including the second semiconductor layer 4 and the second electrode layer 5, that is, the portion sandwiched between the first semiconductor layer 3 and the collector electrode 8 may include a group III-VI compound as a main component. The fact that a group III-VI compound is included as a main component indicates that the concentration of a group III-VI compound (in a case of a plurality of kinds of group III-VI compounds, the total thereof) is 50 mol % or more in the compounds constituting the portion including the second semiconductor layer 4 and the second electrode layer 5. The concentration of the group III-VI compound may be 80 mol % or more. The concentration of Zn in the portion including the second semiconductor layer 4 and the second electrode layer 5 may be 50 at % or less. This improves humidity resistance of the photoelectric conversion device 10. Further, the concentration of Zn in the portion including the second semiconductor layer 4 and the second electrode layer 5 may be 20 at % or less.

The photoelectric conversion device 10 is electrically connected to the neighboring photoelectric conversion device 10 via the connection conductor 7. Accordingly, as shown in FIG. 1, a plurality of photoelectric conversion devices 10 are connected in series to constitute a photoelectric conversion module 20.

The connection conductor 7 connects the second electrode layer 5 and the third electrode layer 6. In other words, the connection conductor 7 connects the second electrode layer 5 of one photoelectric conversion device 10 and the first electrode layer 2 of the other neighboring photoelectric conversion device 10. The connection conductor 7 is formed to divide each of the first semiconductor layers 3 of the neighboring photoelectric conversion devices 10. Accordingly, the electricity photoelectrically converted by the first semiconductor layer 3 can be extracted as a current through series connection. The connection conductor 7 may be formed with the second electrode layer 5 in the same step to be integrated with the second electrode layer 5. This enables to simplify the step of forming the connection conductor 7. Further, the above-mentioned method provides good electrical connection between the connection conductor 7 and the second electrode layer 5, accordingly this leads to enhanced reliability.

The collector electrode 8 has a function of reducing the electrical resistance of the second electrode layer 5. This allows the current generated in the first semiconductor layer 3 to be extracted efficiently. As a result, power generation efficiency of the photoelectric conversion devices 10 can be increased.

As shown in FIG. 1, for example, the collector electrode 8 is linearly formed from one end of the photoelectric conversion device 10 to the connection conductor 7. Accordingly, the charges generated by photoelectric conversion in the first semiconductor layer 3 are collected by the collector electrode 8 through the second electrode layer 5. The collected charges are conducted to the neighboring photoelectric conversion device 10 through the connection conductor 7. Therefore, the provision of the collector electrode 8 enables to efficiently extract the current generated in the first semiconductor layer 3 even if the second electrode layer 5 is made thinner. This leads to an increase of power generation efficiency.

It is sufficient that the width of the linear collector electrode 8 is, for example, 50 to 400 μm. This enables to achieve conductivity without excessively reducing a light-receiving area of the first semiconductor layer 3. Further, the collector electrode 8 may include a plurality of branch portions.

The collector electrode 8 is formed of a metal paste obtained by dispersing a powdered metal such as Ag in a resin binder or the like. The collector electrode 8 is formed by, for example, printing a metal paste into a desired pattern shape by screen printing or the like, and then curing the metal paste.

The collector electrode 8 may include solder. This enables to enhance the tolerance to a bending stress and reduce a resistance further. The collector electrode 8 may include two or more kinds of metals having different melting points. On this occasion, it is sufficient that the collector electrode 8 is obtained by melting at least one kind of metal, heating the melted metal at a temperature at which the other at least one kind of metal does not melt, and then curing the heated metal. As a result, the metal having a lower melting point melts first, whereby the collector electrode 8 is densified. Accordingly, the resistance of the collector electrode 8 decreases. Meanwhile, the metal having a higher melting point acts so as to keep the shape of the collector electrode 8.

It is sufficient that the collector electrode 8 is provided so as to reach the peripheral edge of the first semiconductor layer 3 in plan view. In such a manner, the collector electrode 8 can protect the peripheral portion of the first semiconductor layer 3 and reduce the occurrence of chipping in the peripheral portion of the first semiconductor layer 3. The collector electrode 8 as described above is capable of efficiently extracting the current generated in the peripheral portion of the first semiconductor layer 3. This increases power generation efficiency.

In such a manner, the peripheral portion of the first semiconductor layer 3 can be protected, so that the total thickness of the members provided between the first electrode layer 2 and the collector electrode 8 can be reduced. This enables to reduce the amount of members. Further, the steps of forming the first semiconductor layer 3, the second semiconductor layer 4, and the second electrode layer 5 corresponding to the above-mentioned members can be shortened. It is sufficient that the total thickness of the first semiconductor layer 3, the second semiconductor layer 4, and the second electrode layer 5 is, for example, 1.56 to 2.7 μm. Specifically, the thickness of the first semiconductor layer 3 is 1 to 2.5 μm. The thickness of the second semiconductor layer 4 is 0.01 to 0.2 μm. The thickness of the second electrode layer 5 is 0.05 to 0.5 μm.

At the peripheral edge of the first semiconductor layer 3, the end surface of the collector electrode 8, the end surface of the second electrode layer 5, and the end surface of the first semiconductor layer 3 may be flush with each other. This enables to extract the current well, which is photoelectrically converted in the peripheral edge of the first semiconductor layer 3. Note that in plan view of the collector electrode 8, the collector electrode 8 does not need to reach the peripheral edge of the first semiconductor layer 3. For example, the occurrence of chipping starting from the peripheral edge of the first semiconductor layer 3 and the progression of the chipping can be reduced if the distance between the peripheral edge of the first semiconductor layer 3 and the end of the collector electrode 8 is 1,000 μm or less.

The present invention is not limited to the embodiment described above, and numerous modifications and variations can be devised in the described aspects without departing from the scope of the invention.

DESCRIPTION OF REFERENCE NUMERALS 1 substrate
2 first electrode layer (electrode layer)
3 first semiconductor layer
4 second semiconductor layer
5 second electrode layer
6 third electrode layer
7 connection conductor
8 collector electrode
10 photoelectric conversion device
20 photoelectric conversion module

The invention claimed is:
1. A photoelectric conversion device, comprising:
an electrode layer;
a first semiconductor layer located on the electrode layer and comprising a chalcopyrite-based compound semiconductor of group I-III-VI and oxygen; and
a second semiconductor layer located on the first semiconductor layer and forming a pn junction with the first semiconductor layer,
wherein in the first semiconductor layer, a molar concentration of oxygen in a part located on the electrode layer side with respect to a center portion in a lamination direction of the first semiconductor layer is higher than a molar concentration of oxygen in the whole of the first semiconductor layer.

2. The photoelectric conversion device according to claim 1, wherein the molar concentration of oxygen of the first semiconductor layer gradually increases from a part on the second semiconductor layer side toward the part on the electrode layer side.

3. The photoelectric conversion device according to claim 1, wherein in the first semiconductor layer, a molar concentration of oxygen in a part located near the second semiconductor layer is higher than the molar concentration of oxygen in the whole of the first semiconductor layer.

4. The photoelectric conversion device according to claim 1, wherein
the chalcopyrite-based compound semiconductor comprises a plurality of crystal grains, and
in the first semiconductor layer, an average grain diameter of the crystal grains in the part located on the electrode layer side with respect to the center portion in the lamination direction of the first semiconductor layer is smaller than an average grain diameter of the crystal grains in the whole of the first semiconductor layer.

5. The photoelectric conversion device according to claim 1, wherein the first semiconductor layer comprises selenium, and a molar concentration of selenium in the part located on the electrode layer side with respect to the center portion in the lamination direction of the first semiconductor layer is lower than a molar concentration of selenium in the whole of the first semiconductor layer.

6. The photoelectric conversion device according to claim 5, wherein the electrode layer comprises molybdenum, and the molar concentration of selenium in a part located near the electrode layer is higher than the molar concentration of selenium in the part located on the electrode layer side with respect to the center portion in the lamination direction of the first semiconductor layer.

7. The photoelectric conversion device according to claim 1, wherein the first semiconductor layer comprises gallium, and a molar concentration of gallium in the part located on the electrode layer side with respect to the center portion in the lamination direction of the first semiconductor layer is lower than a molar concentration of gallium in the whole of the first semiconductor layer.

* * * * *